United States Patent
Franz et al.

(10) Patent No.: US 7,192,483 B2
(45) Date of Patent: Mar. 20, 2007

(54) METHOD FOR DIAMOND COATING SUBSTRATES

(75) Inventors: David Franz, Sevelen (CH); Johann Karner, Feldkirch (AT)

(73) Assignee: Unaxis Balzers Aktiengesellschaft (LI)

( * ) Notice: Subject to any disclaimer, the term of this patent is extended or adjusted under 35 U.S.C. 154(b) by 0 days.

(21) Appl. No.: 10/491,858

(22) PCT Filed: Oct. 7, 2002

(86) PCT No.: PCT/EP02/11226

§ 371 (c)(1),
(2), (4) Date: Sep. 16, 2004

(87) PCT Pub. No.: WO03/031675

PCT Pub. Date: Apr. 17, 2003

(65) Prior Publication Data

US 2005/0016444 A1    Jan. 27, 2005

(30) Foreign Application Priority Data

Oct. 8, 2001 (DE) ............................. 101 49 588

(51) Int. Cl.
*C30B 29/24*    (2006.01)
(52) U.S. Cl. ............... 117/86; 117/94; 117/95; 117/104; 117/105; 117/929; 423/446
(58) Field of Classification Search ............ 117/86, 117/94, 95, 929, 105, 104; 423/446
See application file for complete search history.

(56) References Cited

U.S. PATENT DOCUMENTS 5,435,849 A * 7/1995 Cann et al. ............. 118/723 R
5,645,897 A * 7/1997 Andra ....................... 427/526
5,762,715 A * 6/1998 Patten et al. ............... 118/730
5,902,649 A * 5/1999 Karner et al. ............. 427/576
6,099,652 A * 8/2000 Patten et al. ............... 118/724
6,173,672 B1 * 1/2001 Shepard, Jr. ............. 118/723 R
6,685,994 B1 * 2/2004 Karner et al. ............. 427/569

FOREIGN PATENT DOCUMENTS

EP    0 478 909    4/1992
EP    0 724 026    7/1996
GB    2 178 228    2/1987

OTHER PUBLICATIONS

Naoto Ohtake et al., "Diamond film preparation by arc discharge plasma jet chemical vapor deposition in the methane atmosphere", *Journal of Electrochemical Society*, vol. 137, No. 2, Feb. 1, 1990, pp. 717-722.

* cited by examiner

Primary Examiner—Robert Kunemund
(74) Attorney, Agent, or Firm—Koda & Androlia

(57) ABSTRACT

The present invention relates to a method for diamond coating of substrates in which the substrate is exposed in a vacuum atmosphere to a reactive gas mixture excited by means of a plasma discharge, the plasma discharge comprising a plasma beam (14) in an evacuated receiver (16) that is formed between a cathode chamber (1) and an anode (2), and the reactive gas mixture comprising a reactive gas and a working gas, the reactive gas in (9) and the working gas in (8) and/or (9) introduced into the receiver, and the receiver (16) is evacuated by a pump arrangement (15), and the hydrogen concentration of the reactive gas mixture being 0–45 vol. %.

21 Claims, 3 Drawing Sheets

METHOD FOR DIAMOND COATING SUBSTRATES

FIELD OF THE INVENTION

The present invention relates to a method for diamond coating of substrates in which the substrate in a vacuum atmosphere is exposed to a reactive gas mixture which is excited by means of a plasma discharge.

BACKGROUND OF THE INVENTION

Coating of substrates by means of CVD (chemical vapour deposition) is widely used. For example, diamond coatings or films produced by means of CVD are suitable as protective coatings for tools and precision components, e.g. seals, and for use in micro electro mechanical systems (MEMS), in field emission displays (FED) and in apparatuses that exploit surface acoustic waves (SAW).

The use of CVD coating methods for diamond coating on an industrial scale requires safe-to-handle process parameters, uniform coatability of, e.g., highly curved or pointed surface elements and edges, and coating equipment of adequate size. These requirements are not met by all CVD coating methods described so far.

For example, the microwave plasma coating method described in U.S. Pat. No. 5,849,079 and U.S. Pat. No. 5,770,2760 requires an overall pressure of $5 \times 10^3$–$10^5$ Pa, which is relatively high. As the cell volume of microwave reactors is very small, the coatable area per coating operation is a maximum of roughly 200 cm$^2$, which leads to very high coating costs. In microwave plasma coating methods, larger layer thicknesses are additionally deposited on edges and tips, so that uniform coating is not possible.

These disadvantages are avoided in the method described in EP 0724026 and WO 01/04379, in which the plasma is generated by a discharge, preferably by a high arc current discharge. This process proceeds preferably at an overall pressure that is lower than with the microwave plasma process by a factor of roughly $10^3$ and enables a coatable surface per coating operation that is higher by a factor of $10^1$–$10^2$ or more. Furthermore, the method described in EP 0724026 and WO 01/04379 permits uniform coating of highly curved surfaces and edges and tips.

Coatings deposited by means of CVD methods are described as microcrystalline or nano-crystalline with respect to the average size of the deposited crystallite particles, which may be determined, e.g., by transmission electron microscopy. With microcrystalline coatings, the average crystallite size is greater than 1 µm and varies typically between 1 and 10 µm. With nanocrystalline coatings, the average crystallite size, by contrast, is smaller than 1 µm and especially smaller than 100 nm. Control and adjustability of the average crystallite size are important for optimizing properties of the diamond coatings, such as their hardness, surface roughness and their electrical and optical characteristics.

Whereas the microwave plasma techniques permit the deposition of nanocrystalline diamond coatings (U.S. Pat. No. 5,772,760 and Ann. Rev. Mater. Sci. 29 (1999), 211–259), this has not yet been reported for CVD coatings techniques that can be used on an industrial scale.

The present invention was therefore directed to finding an industrial scale, i.e. economically viable, CVD method for producing diamond coatings that does not have the disadvantages described in the prior art, or only to a lesser extent, and permits especially the deposition of nanocrystalline diamond coatings. Further objects of the present invention result from the following detailed description.

SUMMARY OF THE INVENTION

The present invention relates to a method for diamond coating of substrates in which the substrate is exposed in a vacuum atmosphere to a reactive gas mixture excited by means of a plasma discharge, the plasma discharge comprising a plasma beam (14) in an evacuated receiver (16) that is formed between a cathode chamber (1) and an anode (2), and the reactive gas mixture comprising a reactive gas and a working gas, the reactive gas in (9) and the working gas in (8) and/or (9) introduced into the receiver, and the receiver (16) is evacuated by a pump arrangement (15), and the hydrogen and concentration of the reactive gas mixture being 0–45 vol. %. In a preferred embodiment, the hydrogen concentration is chosen in the concentration range 0–45 vol. % such that the diamond coating has an average crystallite size of less than 50 nm and preferably between 1 and 30 nm.

The present invention also relates to a substrate on whose surface at least a first and a second layer are deposited, the first layer being closer to the substrate surface than the second layer and containing aluminium, silicon, or an element of groups IVB, VB, VIIB or VIIB of the periodic table in an elemental form or as a compound, and the second layer being located on the first layer and consisting of a diamond coating obtainable in accordance with the method of the present invention.

DETAILED DESCRIPTION OF THE INVENTION

The reactive gas mixture comprises a reactive gas and a working gas, whereby both the reactive gas and the working gas may contain one or more gases independently of each other. The concentration of hydrogen or other gases in the reactive gas and the concentration of argon or other gases in the working gas, above and below, are given in the present description in volume percent (vol. %). The term diamond coatings or also films and diamond crystallites in the context of the present invention is to be broadly understood and, above and below, comprises diamond coatings or diamond crystallites also modified by the incorporation of foreign atoms or foreign atom clusters.

Figure 1:
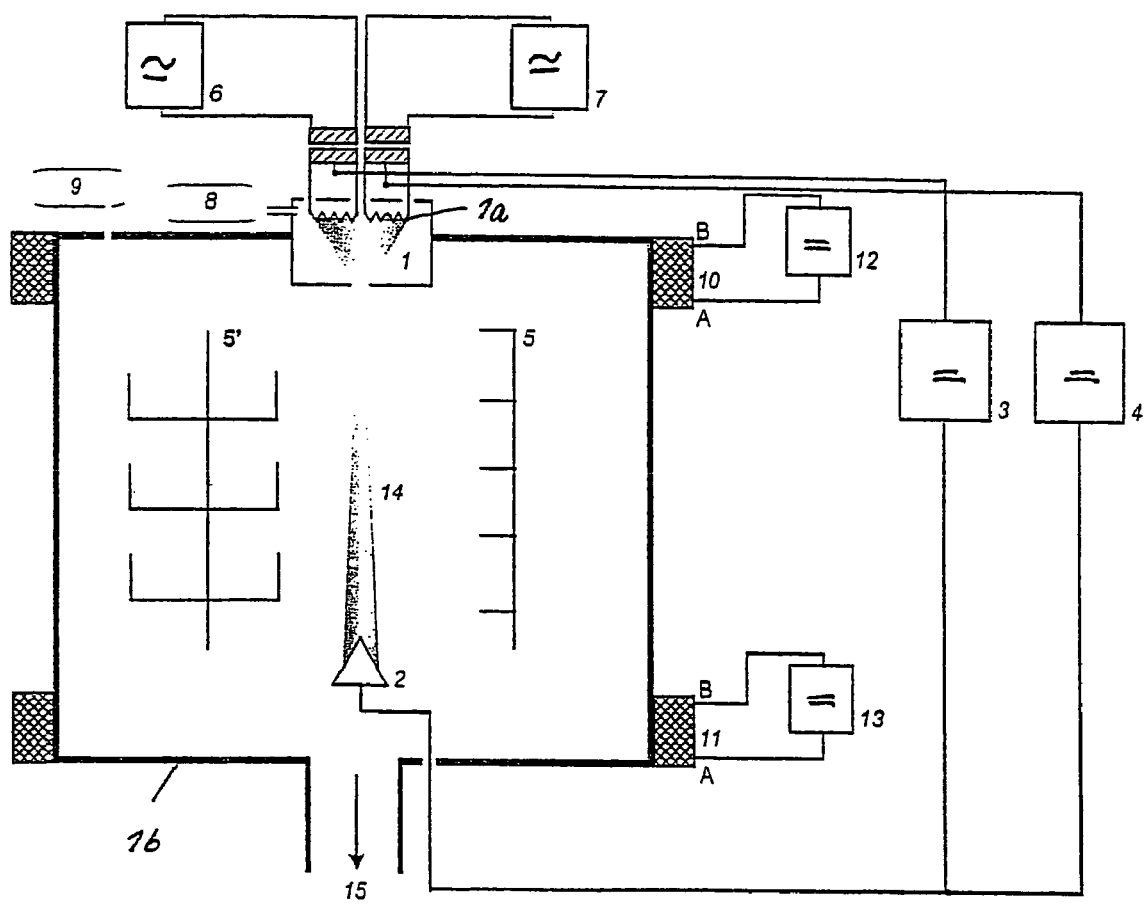
FIG. 1 is a schematic illustration of a plasma beam discharge arrangement which can be used in accordance with the invention.

FIG. 1 is a schematic presentation of a plasma beam discharge arrangement which can be used in accordance with the invention and which is described in detail in EP 0724026 and WO 01/04379. In a vacuum receiver 16, the plasma beam 14 is generated between a cathode chamber 1 and an anode 2. In the arrangement shown in FIG. 1, cathode chamber 1 comprises two hot cathodes 1*a* fed by two heating current generators 6, 7. The use of two or more heating current cathodes 1*a* is optional, but permits greater variability of the plasma density. The discharge generators 3, 4 are connected between the hot cathodes 1a and the anode 2. The plasma beam 14 is preferably generated as a low voltage arc discharge and especially as a high current arc discharge. Especially preferred is the use of a hot cathode low voltage high current arc discharge as shown in FIG. 1, although a cold cathode arc discharge can also be used. The discharge generators 3, 4 are usually designed as direct current generators. Several modes may be used during use, such as pulsed direct current, alternating current (AC) superimposed on direct current and, in the broadest sense, modulated direct current, in addition to continuous direct current (DC).

Reactive gas is introduced on the cathode side 9 into the receiver 16, and the working gas is fed into the cathode chamber 1 or the receiver 16 at 8 and/or 9. Receiver 16 is evacuated via a pump arrangement 15, which is preferably arranged such that a gas flow through receiver 16 is generated essentially parallel to the axis of the plasma discharge 14.

The plasma density distribution of the plasma beam 14 along its axis may be influenced by a magnetic field H that is generated by coils 10, 11 with the corresponding power supplies 12, 13. The coil arrangement 10, 11 is chosen preferably such that a magnetic field H is generated essentially parallel to the axis of the plasma beam 14.

The substrates for coating are introduced, e.g., on substrate support arrangements 5,5', into receiver 16. The substrates are preferably arranged at a distance from the axis of the plasma beam 14 such that they lie in a plasma density region in which the plasma density is 20% at most of the plasma density maximum on the axis of the plasma beam 14. The distance of the substrate from the axis of the plasma beam is preferably 3–30 cm and especially 3–20 cm.

Further information on optimising the distance of the substrates from the axis of the plasma beam 14 is to be found in EP 0724026, to which express reference is made and the contents of which are incorporated into the present patent. The distance of the substrates from the axis of the plasma beam is chosen preferably such that the electrical discharge power of the plasma beam 14 per unit area of the surface of the substrate to be coated is at least 10 W/cm$^2$ and preferably at least 30 W/cm$^2$.

The arrangement in FIG. 1 is to be understood as an example and is meant to illustrate the present invention without limiting it. In WO 01/04379, to which express reference is also made and the contents of which are incorporated into the present patent, e.g., further plasma discharge arrangements are disclosed that can be used in accordance with the invention and that have at least two plasma beam discharge arrangements for generating predetermined plasma density distributions.

The arrangement of the substrates at a distance from the axis of the plasma beam 14 leads on the one hand to a relatively high degree of homogeneity of the plasma density distribution in the region of the substrate, this making possible the deposition of uniform layers. On the other, the generation of a long plasma beam 14 and the exploitation of a region of small plasma density at a distance from the axis of the plasma beam creates a large coating area, as a result of which coating can be performed on an industrial scale and economically.

The reactive gas mixture comprises the reactive gas, which in the arrangement shown in Figure is introduced into the recipient 16 at 8, and of the working gas, which is introduced through line 8 and/or 9 into cathode chamber 1. The described arrangement of the inlet lines 8 and 9 for the reactive gas and for the working gas are to be understood as examples and other geometries can also be chosen. The flow of the reactive gas mixture is preferably 200–10,000 sccm (standard cubic centimeters per minute) and especially preferably 500–5000 sccm.

The reactive gas results in the deposition of diamond coatings and can consist of one or more gaseous compounds and/or elements under the chosen deposition conditions. The reactive gas for the diamond coating can contain, e.g., gaseous hydrocarbon compounds, such as $CH_4$ and/or $C_2H_6$. However, carbon can be equally well introduced into the reactive gas by a physical process, such as electron beam evaporation, thermal evaporation or sputtering. To modify the diamond coatings or the diamond crystallites, further gas compounds may be added to the reactive gas; thus, $N_2$ or $NH_3$ is suitable as a nitrogen carrier for incorporating nitrogen.

The reactive gas may also contain hydrogen $H_2$ as a further component.

The working gas serves to maintain the discharge and comprises especially one or more noble gases, e.g. helium He, argon Ar and/or other noble gases. He and Ar are especially preferable.

It was found that, through varying the $H_2$ concentration in the reactive gas mixture,
   the average size of the crystallites of the deposited diamond coating
   and the substrate temperature established without external additional heating can be set and optimized.

Through reduction and controlling of the $H_2$ concentration in the reactive gas mixture, much lower substrate temperatures, i.e., deposition temperatures, can be used in comparison with higher $H_2$ concentrations. The substrate temperature in the method of the current invention is preferably not regulated externally but results primarily from the energy released due to the recombination of plasma species, such as free-radicals especially, to form larger molecules; an example is the recombination of H free-radicals to form a $H_2$ molecule. The radiated arc energy, by contrast, plays a lesser role in the substrate temperature. It was found that varying the $H_2$ concentration enabled the substrate temperatures to be controlled and set over a wide range between roughly 300 and 900° C. and preferably between 350 and 800° C. and especially preferably between 350 and 750° C., without the need for external additional heating. The lower the $H_2$ concentration and the concentration of the reactive gases in the flow of the reactive gas mixture, the lower are the substrate temperatures obtained.

If a substrate temperature is to be set that differs from the substrate temperature which is established at a certain reactive gas mixture, the substrate temperature can additionally be controlled externally, such as by means of an electrical resistance heater or a cooling apparatus. Through additional external heating of the substrate to temperatures of, e.g., 800–900° C. at low $H_2$ concentration in the gas mixture flow, nanocrystalline coatings with a much higher deposition rate are obtained than without additional external heating. Thus, for example, increasing the substrate temperature from 550–700° C. to 900° C. approx. trebles the deposition rate.

At a given $H_2$ concentration, the deposition rate can be varied via the external regulation of the substrate temperature, as a result of which, e.g., the density of the deposited coatings is influenced.

It was further found that, e.g., the known plasma discharge arrangements shown as an example in FIG. 1 afford a method for coating substrates with diamond layers in which the average size of the deposited diamond crystallites can be controlled, and, especially, also deposition of nanocrystalline diamond coatings is possible. This was surprising since, for example, in M. Pedrazzini et al., Diamond related Materials, 5 (1996), 217 and in J. Karner et al., Materials Science and Engineering, A209, 1996, 405, a high concentration of atomic hydrogen is described as critical for the deposition of diamond layers in the HCDCA technique (High Current Density Arc Plasma) described in EP 07204026 and WO 01/04379.

For control over the average size of the diamond crystallites, the concentration of the $H_2$ in the flow of the reactive gas mixture has to be set to below 45%, preferably below 30% and especially preferably below 20%. It was further found that when low-hydrogen reactive gases with a hydrogen concentration of 0 to around 20% expressed in terms of the flow of a reactive gas mixture were used, nanocrystalline diamond coatings are obtained, the average crystallite size increasing with rise in hydrogen concentration. The $H_2$ concentration is preferably chosen such that the average size of the crystallites of the nanocrystalline diamond coatings is less than 100 nm, preferably less than 50 nm, especially between 1 and 30 nm, especially preferably less than 20 nm and quite especially preferably less than 10 nm. The average size of the deposited crystallites of the diamond coatings can, e.g., be determined with TEM measurements (transmission electron microscope) (especially the dark field type), as is shown for illustrative purposes for a diamond coating in FIG. 3. The average crystallite size there is defined as the arithmetic mean of the sum of the size of all crystallites of the diamond coating.

The following overview shows preferred ranges for important process parameters of the method of the present invention.

| | |
|---|---|
| Arc current: | 50–750 A, especially 50–400 A |
| Magnetic field in the centre of the plasma beam: | 0–200 Gauss, especially 0–100 Gauss |
| Overall pressure of the reactive gas mixture: | $10–10^3$ Pa |
| Reactive gas: | |
| $H_2$ | 0–45%, preferred 0–40%, especially preferred 0–30% and quite especially preferred 0–20% |
| Other reactive gases | 0.1–40%, preferred 0.1–25%, especially preferred 0.5–20% and quite especially preferred 0.5–10% |
| Working gas | Remainder up to 100% |
| Distance from the arc axis | 3–30 cm, especially 3–20 cm |

In the preferred low voltage arc discharge of the present invention, a voltage range of 10–200 V is established, preferably 30–120 V.

The diamond coatings have a very dense structure with no column growth in the hydrogen concentration range of 0–20%. Owing to the very small average size of the diamond crystallites, extremely thin diamond coatings with an average thickness of, e.g., 1–2 μm or even <1 μm can be obtained. The diamond coatings in this hydrogen concentration range can further have very small roughness values of, e.g., Rz<0.030 μm and especially Rz<0.020 μm and/or Ra<0.010 μm and especially Ra<0.008 μm, with the roughness depth Rz and the average roughness value Ra defined in accordance with DIN EN ISO 4287. It must be ensured that the surface used for deposition has an adequately low surface roughness. If the surface roughness of the substrate is too great, the surface roughness of the diamond coating or the diamond film reflects the surface roughness of the substrate and can therefore be greater than it might have been, on the basis of the low average size of the diamond crystallites, if a smoother substrate had been used.

It was further found that, in a transition area between roughly 20% and 30% hydrogen, expressed in terms of the gas mixture flow, a mixture of microcrystalline crystallites and nanocrystalline crystallites was obtained, so that a relatively broad distribution of the average size of the crystallites occurred. By varying the hydrogen concentration in this range, it is possible, for instance, to vary and adjust the degree of coverage of the surface of the diamond film with microcrystalline particles.

If the hydrogen concentration is chosen between 30% and 45%, expressed in terms of the gas mixture flow, microcrystalline diamond coatings are obtained, with the average size of the crystallites capable of being influenced by varying the hydrogen concentration. In this hydrogen concentration range, column growth of the diamond crystallites is observed.

It was further found that the average crystallite size, the surface morphology, the density of the diamond coatings in the various hydrogen concentration ranges and, e.g., the electrical characteristics can be changed by varying the arc current, the magnetic field, the overall pressure, the distance from the arc axis and/or the gas composition. Especially preferable ranges of the said process parameters for the deposition of diamond are summarized in Table 2. The concentration of hydrogen in the flow of the reactive gas mixture is preferably 0–30%, especially preferably 0–25% and quite especially preferably 0–20%.

Methods in accordance with the present invention in which the $H_2$ concentrations in the flow of the reactive gas mixture are less than 20% are preferred. Especially preferred are methods in accordance with the present invention in which the $H_2$ concentrations in the flow of the reactive gas mixture are less than 20% and in which the substrate temperatures are lower than 750° C. and especially between 300 and 700° C. As opposed to this, for example, microcrystalline diamond layers are typically deposited at high $H_2$ concentrations in the gas mixture flow of typically more than 45% and at temperatures of more than 750° C. and especially between 750 and 900° C.

Through the reduction of the $H_2$ concentration and the lowering of the substrate temperature, the design requirements imposed on the deposition apparatus, such as the arrangement shown in FIG. 1, are substantially simplified. Thus, for example, conventional rust-free steel can be used for producing the deposition apparatus, and the service life of the apparatuses is substantially increased compared with equipment that is operated at high temperatures and/or high $H_2$ concentrations. On account of the low $H_2$ concentration and the resultant dilution of the explosive $H_2$ gas in the gas mixture flow, the safety precautions that have to be observed when operating the deposition apparatuses are lower. Furthermore, conventional apparatuses can be used to manipulate the substrate, such as are used, e.g., in PVD processes (physical vapour deposition) to control and move the substrate. By controlling the $H_2$ concentration, the substrate temperature can be set, as a result of which external temperature control can be dispensed with.

The use of low substrate or deposition temperatures permits deposition of intermediate layers between the substrate surface and the diamond coating applied subsequently. Such intermediate layers, which, e.g., can serve as diffusion barriers against diffusion of heavy metals from the substrate into the diamond coating over the intermediate layer or, as adhesion promoters, can improve anchorage of the diamond coating to the substrate, frequently have a relatively low thermal stability and are impaired by temperatures of, e.g., more than 800° C. Deposition of such intermediate layers therefore requires control over and adjustment of the substrate temperature. Examples of intermediate layers may be amorphous films containing, e.g., DLC (diamond-like carbon) or WC/C (tungsten carbide/carbon). Preferred furthermore are intermediate layers that contain Al, Si or elements from groups IVB–VIIB of the periodic table, such as Cr, Ti, W or Zr in elemental form or in the form of compounds, such as carbides, borides, nitrides, carbonitrides, carboborides, nitroborides, oxinitrides, carbonitroborides.

An example of an intermediate layer is chromium carbide $Cr_xC_y$, which can serve to improve adhesion between a substrate and a diamond coating. The composition of the chromium carbide is preferably varied via the thickness of the intermediate coating such that the C fraction in the chromium carbide at the substrate surface is low and preferably 0%. The carbon fraction in the chromium carbide is then preferably continuously increased with increasing distance from the substrate surface in the direction of the diamond coating lying above the intermediate coat to produce a high value and especially 100% at the diamond layer/intermediate layer phase boundary. Conversely, the chromium fraction in the chromium carbide at the substrate surface is preferably high and especially 100%, decreasing preferably to a small value and especially to 0% at the phase boundary of the intermediate layer/diamond layer. This variation in the chromium carbide composition across the thickness of the intermediate layer causes its polarity to be varied and adjusted to the non-polar nature of the surface of the diamond coating on the one side and to the polar substrate surface on the other side, as a result of which adhesion reinforcement occurs between substrate surface and diamond layer.

Especially with cobalt-containing substrates, such as in many hard metals, the said intermediate layers function also as diffusion barriers for cobalt. In the absence of the intermediate layer, cobalt diffuses to the surface and leads to a deterioration in the anchorage of the diamond layer. The effect of the intermediate layers as diffusion barrier when low $H_2$ concentrations are used in the gas mixture flow is further amplified by the fact that a reduction in the diffusion rate of Co occurs in the substrate as a result of the lower substrate temperatures.

The said intermediate layers can, e.g., in the arrangement shown in FIG. 1, be deposited before deposition of the diamond coating. It is also possible, however, for the intermediate layers to be generated in another CVD arrangement and for the substrate furnished with the intermediate layer to then be transferred into an arrangement in accordance with FIG. 1 for deposition of the diamond coating.

The thickness of the intermediate layers is preferably between 0.1 and 4 µm.

The method of the present invention is especially suitable for large-area, homogeneous coating of substrates, especially with nanocrystalline diamond coatings, and is therefore suitable for use on an industrial scale.

The nanocrystalline diamond coatings that can be produced in accordance with the present invention are suitable on account of the small average crystallite size, the dense structure and the attainable low surface roughness for a large number of applications in which microcrystalline diamond coatings can be used with limited success or not at all. Thus, nanocrystalline diamond coatings have, e.g., good acoustic properties, and are suitable for the production of SAW (surface acoustic waves) apparatuses and arrangements. The speed of surface acoustic waves in nanocrystalline diamond coatings on a ZnO substrate is, e.g., 10,500 m/s and is thus approximately three times as high as in $SiO_2$ or $LiNbO_3$ films.

Nanocrystalline diamond coatings are further suitable especially for the production of micro electro mechanical systems (MEMS) and for the production of field emission displays (FED).

The thickness of nanocrystalline diamond coatings can be varied over a wide range extending from, e.g., 200 nm–20 µm and especially between 500 nm and 15 µm, with thicknesses also capable of being produced outside these preferred thickness ranges. Diamond coatings with a thickness of 2 µm or less are notable for reduced internal stress relative to thicker coatings. On account of their high density and low surface roughness, nanocrystalline diamond coatings lead to preferred surface coatings and finishes. Thus, precision components, such as seals, can be preferably coated. Nanocrystalline coatings with a small thickness of, e.g., up to 2 µm permit preferably the coating of sharp-edged corners, edges and tips and thus a more advantageous coating, relative to other thicker diamond films of, e.g., cutting tools or also field emission displays (FED).

The electrical properties especially of nanocrystalline diamond coatings can be selectively modified by incorporating foreign atoms or foreign atom clusters. Thus, for example, the extremely high resistivity of pure diamond coatings or films, which may be obtained, e.g., by using a $CH_4$/Ar gas mixture, can be reduced by adding $N_2$ to the gas mixture flow, with the resistivity capable of being adjusted by varying the $N_2$ concentration of preferably between 0 and 10% and especially preferably between 0 and 5%. Through the incorporation of nitrogen into the diamond coating during the deposition process, the substrate can, for example, be switched to a DC bias potential or to an AC potential or to a mixed AC+DC potential, such as a pulsed potential, a fact that avoids problems during the formation of the arc beam on the substrate that can occur when covering the substrate with a coating or a film of very high specific resistance.

Although diamond coatings and, on account of their low surface roughness, especially nanocrystalline diamond coatings have very low coefficients of friction, the coefficients of friction of diamond layers can be further reduced by deposition of solid lubricants, such as DLC (diamond-like carbon), WC/C (tungsten carbide/carbon) or other metal carbide/carbon phases, $MoS_2$ (molybdenum disulphide) or graphite. Furthermore, the running-in properties of machine parts that perform slip or rolling movements against each other and are furnished with a diamond coating can be improved if a top coating with the said solid lubricants is applied to the diamond coating. A certain degree of transfer of top-coating material occurs until perfect slip of the complementary parts, such as ball-bearing and shaft, against each other is obtained. The application of such top coatings to drills can have the effect that the drills unfold a polishing effect simultaneously as the hole is being drilled for the first time, as a result of which, in certain circumstances, e.g., costly machining and polishing of the drilled hole can be dispensed with.

The following examples are intended to further explain the invention without limiting it. Unless stated otherwise, percentage figures in the following examples and in the whole description are always in vol. %, expressed in terms of the reactive gas mixture.

EXAMPLE 1

A hard metal substrate is first cleaned and then placed on a substrate support arrangement 5,5' of a plasma discharge arrangement, as shown schematically in FIG. 1, with the distance from the axis of the plasma beam 14 being set to 3 cm. The diameter of the cylindrical receiver 16 was 0.73 m and the total capacity was 0.270 m$^3$. The distance between the outlet of cathode chamber 1 and the anode and thus the arc length was 0.7 m.

Receiver 16 was evacuated with the help of pump arrangement 15. The working gas was Ar, the reactive gas consisted of $CH_4$ and a gas flow of the reactive gas mixture was selected with the following composition at an overall pressure of 150 Pa (1.5 mbar).

| | |
|---|---|
| Ar | 97.5% |
| $CH_4$ | 2.5% |

The gas flow was 3,500 sccm.

The plasma discharge was then switched on and the hard metal substrate was coated with a diamond film in a coating time of 4 h in an arc current of 50 A in the presence of a magnetic field with a field strength of 100 Gauss. The parameters of the coating process are summarized in Table 1.

The plasma discharge was then switched off again and the coated substrate was removed from receiver 16.

Figure 2:
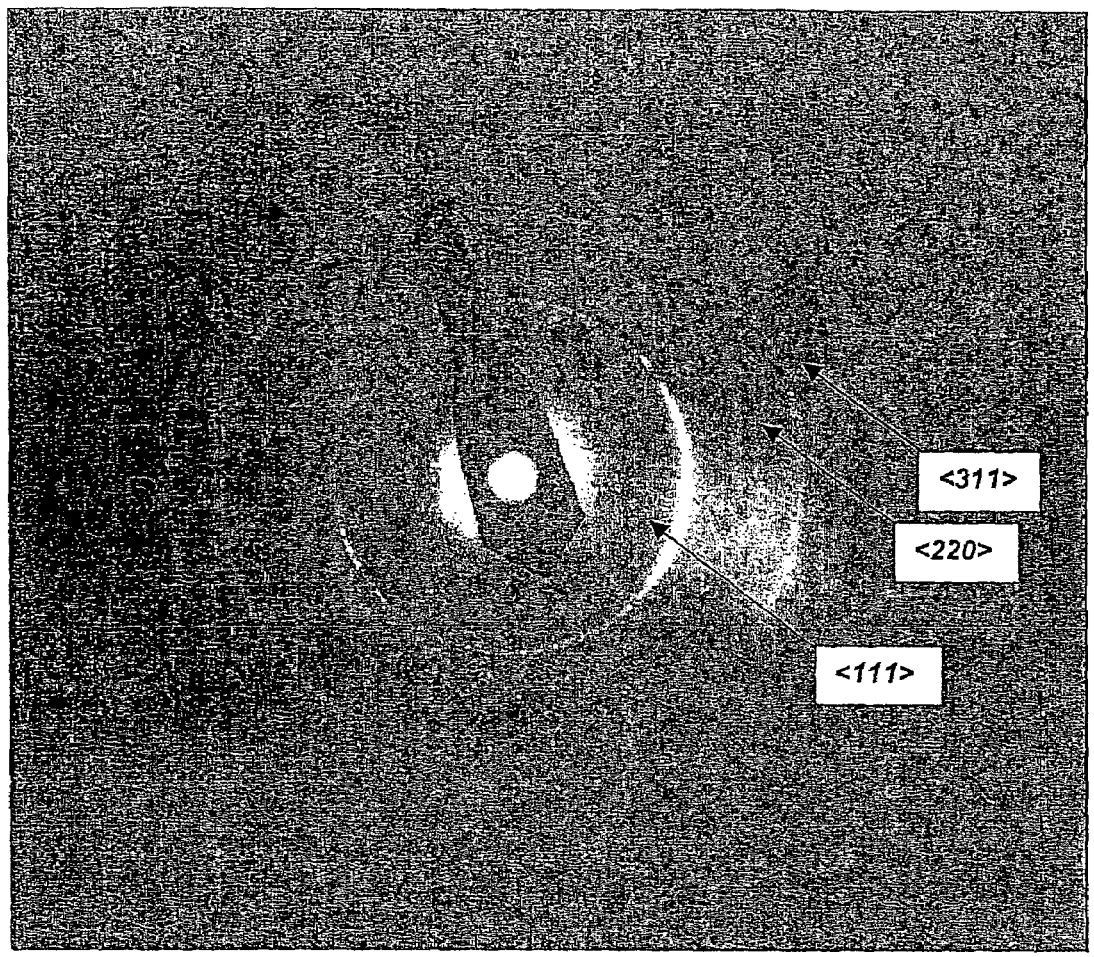
FIG. 2 illustrates an electron diffraction pattern of the deposited nanocrystalline diamond coating in Example 1.

The electron diffraction pattern reproduced in FIG. 2 of the resultant diamond coating shows sharp Bragg reflections in concentric circles, a fact that suggests static orientation of the deposited crystallites. The crystallographic indices quoted in FIG. 2 correspond to those of diamond, whereas no Bragg reflections corresponding to those of graphite were observed.

Figure 3A:
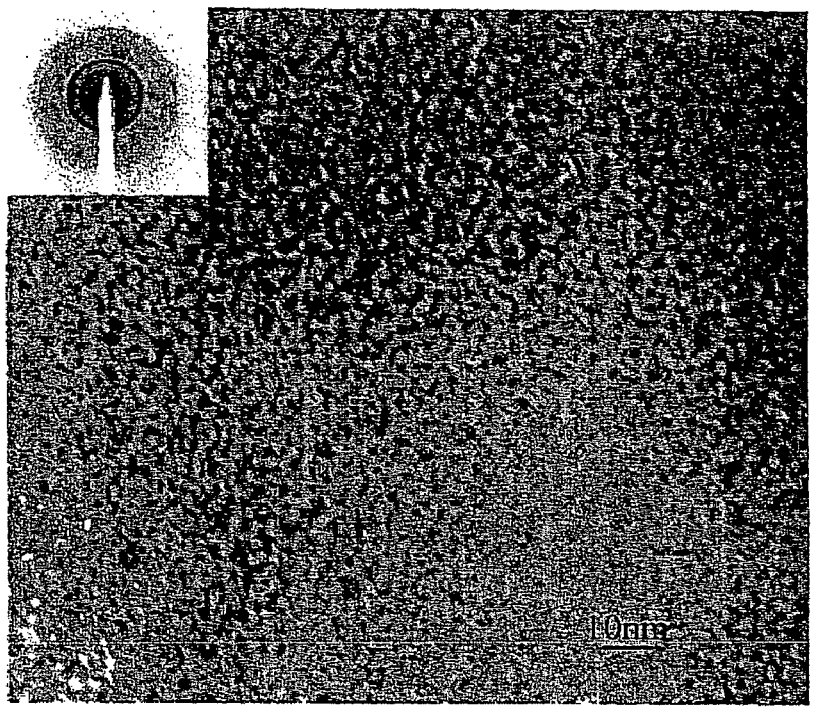
FIG. 3 illustrates a TEM (transmission electron microscope) bright field micrograph (FIG. 3*a*) and a dark field micrograph (FIG. 3*b*) of the deposited nanocrystalline diamond coating in Example 1.
Figure 3B:
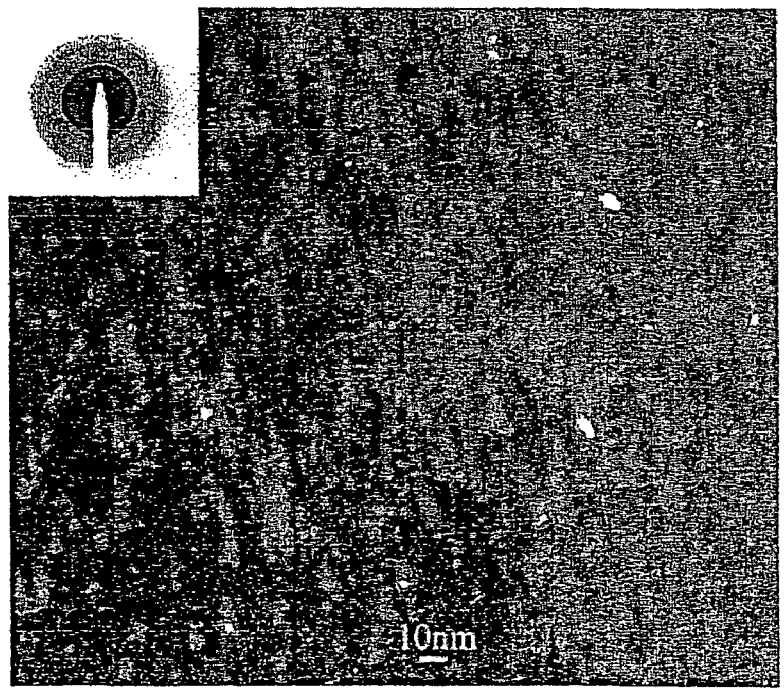

FIG. 3 shows TEM (transmission electron microscope) micrographs of a diamond coating obtained under the conditions of Example 1, with an arc current of 170 A used instead of 50 A. FIG. 3a is a bright field micrograph, while FIG. 3b is a dark field micrograph [of the (111) reflection]. From the dark field micrograph, in which the diamond crystallites show up as white spots, it is particularly easy to estimate that the average size of the diamond crystallites is less than 5 nm. Both the bright field micrograph and the dark field micrograph show that the diamond crystallites are arranged statically and without texture. The diffraction patterns shown in the top left of FIGS. 3a and 3b correspond to the diffraction pattern of diamond and confirm the results as shown in FIG. 2.

Furthermore, SEM (scanning electron microscope) micrographs were made of a plan view of the coated substrate and a cross-section in the direction of the normals to the coated area through the substrate. The plan view showed statically arranged very small diamond crystallites, with the estimate of the average crystallite size from the TEM measurements as shown in FIG. 3 being confirmed. It could be seen from the cross-section that the film has a thickness of 1.2 μm and a dense structure without column growth.

The process parameters used in this example and the properties of the diamond film are reproduced in Table 1. NcD=nanocrystalline diamond film.

COMPARISON EXAMPLE 1

Example 1 was repeated, with a gas flow of the following composition and an overall pressure of 150 Pa (1.5 mbar) and a flow of reactive gas mixture set to 7,000 sccm

| | |
|---|---|
| Ar | 49.5% |
| $H_2$ | 49.5% |
| $CH_4$ | 1.0% | and the remaining process parameters were selected as quoted in Table 1. μcD=microcrystalline diamond film.

SEM (scanning electron microscope) micrographs were made of a plan view of the coated substrate and of a cross-section in the direction of the normal to the coated areas through the substrate. The plan view showed statically arranged diamond crystallites with an average size of >1 μm. It could be seen from the cross-section that the film has a thickness of 6 μm and column growth.

EXAMPLES 2–4

Example 1 was repeated, with the composition of the reactive gas mixture and the remaining process parameters each varied as shown in Table 1. TEM studies revealed in all examples that crystalline diamond coatings with an average crystallite size of less than 50 nm were present.

TABLE 1

| | Example # | | | | |
|---|---|---|---|---|---|
| Process parameter | Comparison Example 1 | Example 1 | Example 2 | Example 3 | Example 4 |
| Arc current [A] | 440 | 50 | 150 | 380 | 400 |
| Magnetic field [Gauss] | 100 | 100 | 100 | 0 | 100 |
| Overall pressure [mbar] | 1.5 | 1.5 | 1.4 | 1.5 | 2 |
| Gas flows [%] | | | | | |
| Ar | 49.5 | 97.5 | 97 | 95 | 82.5 |
| $H_2$ | 49.5 | 0 | 1.5 | 4 | 17 |
| $CH_4$ | 1 | 2.5 | 1.5 | 1 | 1.5 |
| Distance from arc axis [cm] | 12 | 3 | 9 | 9 | 12 |
| Substrate temperature [° C.] | 830 | 550 | 550 | 550 | 750 |
| Coating time [h] | 10 | 4 | 10 | 10 | 10 |
| Growth rate [μm/h] | 0.6 | 0.3 | 0.5 | 0.5 | 0.8 |

TABLE 1-continued

| | Example # | | | | |
|---|---|---|---|---|---|
| | Comparison Example 1 | Example 1 | Example 2 | Example 3 | Example 4 |
| Arc length [cm] | 70 | 70 | 70 | 70 | 70 |
| Geometry of the apparatus: | | | | | |
| Diameter [m] | 0.73 | 0.73 | 0.73 | 0.73 | 0.73 |
| Volume [l] | 270 | 270 | 270 | 270 | 270 |
| Layer properties | | | | | |
| Layer thickness [μm] | 6 | 1.2 | 5 | 5 | 8 |
| Crystal structure | μcD | NcD | NcD | NcD | NcD |

TABLE 2

| Process parameter | Preferred ranges Lower limit / Upper limit | Especially preferred ranges Lower limit / Upper limit |
|---|---|---|
| Arc current [A] | 50 / 750 | 50 / 400 |
| Magnetic field [Gauss] | 0 / 200 | 0 / 100 |
| Overall pressure [mbar] | 0.1 / 1000 | 0.1 / 10 |
| Gas flows [%] | | |
| Ar | Remainder / Remainder | Remainder / Remainder |
| $H_2$ | 0 / 45 | 0 / 40 |
| $CH_4$ | 0.1 / 30 | 0.1 / 10 |
| $N_2$ | 0 / 10 | 0 / 5 |
| Distance from the arc axis [cm] | 3 / 30 | 3 / 20 |

The invention claimed is:

1. Method for diamond coating of substrates in which the substrate is exposed in a vacuum atmosphere to a reactive gas mixture excited by means of a plasma discharge, the plasma discharge comprising a plasma beam (14) in an evacuated receiver (16) that is formed between a cathode chamber (1) and an anode (2), and the reactive gas mixture comprising a reactive gas and a working gas, the reactive gas in (9) and the working gas in (8) and/or (9) introduced into the receiver, and the receiver (16) is evacuated by a pump arrangement (15), and the hydrogen concentration of the reactive gas mixture being 0–20 vol. % and the $H_2$ concentration of the reactive gas mixture is chosen such that the diamond coating has an average crystallite size of less than 50 nm.

2. Method as defined by claim 1, wherein the $H_2$ concentration of the reactive gas mixture is chosen such that the diamond coating has an average crystallite size between 1 and 30 nm.

3. Method as defined by any of claims 1–2, with the $H_2$ concentration of the reactive gas mixture chosen such that the substrate temperature established without external additional heating or cooling is between 300° C. and 750° C.

4. Method as defined by claim 1, with the concentration of the reactive gas in the reactive gas mixture lying between 0.1 and 85 vol. %.

5. Method as defined by claim 4, wherein the reactive gas contains one or more gases, which is chosen from the group of gaseous compounds consisting of $H_2$, C-containing gases and N-containing gases, especially $N_2$.

6. Method as defined by claim 1, wherein the working gas comprises at least one noble gas.

7. Method as defined by claim 1, wherein the plasma beam (14) is formed as a low voltage arc discharge, preferably as high current arc discharge.

8. Method as defined by claim 7, wherein the arc current is between 50 and 750 A.

9. Method as defined by claim 1, wherein the substrate, as far as the region of highest plasma density is concerned, is arranged radially offset along the axis of the plasma beam.

10. Method as defined by claim 9, wherein the distance of the substrate from the axis of the plasma beam is between 3 and 20 cm.

11. Method as defined by any of claims 9–10, wherein the distance of the substrate from the axis of the plasma beam (14) is chosen such that the plasma density in the region of the substrate is at most 20% of the maximum of the plasma density along the axis of the plasma beam (14).

12. Method as defined by claims 1, 2 and 4–10, whereby the plasma density distribution is influenced by a magnetic field that runs essentially parallel to the axis of the plasma beam and is generated by the arrangement of magnetic coils (10, 11).

13. Method as defined by claim 12, wherein the magnetic field on the axis of the plasma beam has a strength of 0–200 Gauss.

14. Method as defined by any of claims 1-2 and 4-10, whereby the substrate temperature lies between 300 and 900° C.

15. Method as defined by any of claims 1–2 and 4–10, characterized by the fact that the overall pressure in the receiver (1) is between 10 and $10^3$ Pa.

16. Method as defined by any of claims 1–2 and 4–10, wherein the flow of the reactive gas mixture runs essentially parallel to the axis of the plasma beam and is between 200 and 10,000 sccm.

17. Method as defined by claims 1–2 and 4–10, wherein the values for the arc current, the magnetic field, the overall pressure, the reactive gas composition, the concentration of the working gas and the distance from the arc axis are chosen from the following ranges:

Arc current: 50–750 A, especially 50–400 A
Magnetic field in the centre 0–200 Gauss, especially 0–100 Gauss -continued

| of the plasma beam: | |
|---|---|
| Overall pressure of the gas mixture: | $10-10^5$, especially $10-10^3$ Pa |
| Reactive gas mixture: | |
| $H_2$ | 0–20% and preferred 0–15% |
| Other reactive gases | 0.1–40%, especially 0–25% and especially preferred 0–15% |
| Working gas | Remainder up to 100% |
| Distance from arc axis | 3–30, especially 3–20 cm. |

18. Method for producing a coated substrate, wherein on the substrate at least a first and a second layer are deposited, the first layer being closer to the substrate surface than the second layer and containing aluminium, silicon, or an element of groups IVB, VB, VIB or VIIB of the periodic table in an elemental form or as a compound, and the second layer located on the first layer and consisting of a diamond coating which is deposited by a method defined in claim 1.

19. Coated substrate as obtainable by the method defined in claim 18.

20. Method for producing a coated substrate, wherein on the substrate at least a first and a second layer are deposited, the first layer being closer to the substrate surface than the second layer and containing aluminium, silicon, or an element of groups IVB, VB, VIB or VIIB of the periodic table in an elemental form or as a compound, and the second layer located on the first layer and consisting of a diamond coating which is deposited by a method defined in claim 17.

21. Coated substrate as obtainable by the method defined in claim 20.

* * * * *

UNITED STATES PATENT AND TRADEMARK OFFICE
CERTIFICATE OF CORRECTION

PATENT NO. : 7,192,483 B2  Page 1 of 1
APPLICATION NO. : 10/491858
DATED : March 20, 2007
INVENTOR(S) : David Franz et al.

It is certified that error appears in the above-identified patent and that said Letters Patent is hereby corrected as shown below:

Title Page, Item [54] Title of Invention:
Change "Method for Diamond Coating Substrates" to --METHOD FOR DIAMOND COATING OF SUBSTRATES--

Signed and Sealed this

Thirtieth Day of June, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,192,483 B2 | Page 1 of 1 |
| APPLICATION NO. | : 10/491858 | |
| DATED | : March 20, 2007 | |
| INVENTOR(S) | : David Franz et al. | |

It is certified that error appears in the above-identified patent and that said Letters Patent is hereby corrected as shown below:

Title Page, Item [54] and Column 1, lines 1 and 2, Title of Invention:
Change "Method for Diamond Coating Substrates" to --METHOD FOR DIAMOND COATING OF SUBSTRATES--

This certificate supersedes the Certificate of Correction issued June 30, 2009.

Signed and Sealed this

Twenty-eighth Day of July, 2009

JOHN DOLL
*Acting Director of the United States Patent and Trademark Office*